(12) United States Patent
Ma

(10) Patent No.: US 6,719,580 B1
(45) Date of Patent: Apr. 13, 2004

(54) LAND GRID ARRAY CONNECTOR ASSEMBLY WITH NON-INTERFERING LEVER

(75) Inventor: Hao-Yun Ma, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/425,214

(22) Filed: Apr. 28, 2003

(30) Foreign Application Priority Data

Oct. 4, 2002 (TW) ...................................... 91215780 U

(51) Int. Cl.[7] .............................................. H01R 13/62
(52) U.S. Cl. ....................................................... 439/331
(58) Field of Search ................................... 439/331, 73

(56) References Cited

U.S. PATENT DOCUMENTS 4,657,328 A * 4/1987 Matsuoka .................... 439/331
4,761,140 A * 8/1988 Geib ........................... 439/71
6,485,320 B1   11/2002 Ma

* cited by examiner

*Primary Examiner*—Neil Abrams
*Assistant Examiner*—Phuong Dinh
(74) *Attorney, Agent, or Firm*—Wei Te Chung

(57) ABSTRACT

An LGA connector assembly includes a fastening device (1) mounted on a PCB (2), and a socket (16) received in the fastening device. The fastening device includes a frame (11), and a lever (13) and a metal clip (12) respectively pivotally mounted on two opposite sides of the frame. The frame includes a lever cam (111) in a middle of an end thereof. The lever cam defines a locating slot (112) extending therethrough. The lever includes a locating portion (131) received in the locating slot of the frame, an L-shaped driving portion (133) extending from an end of the locating portion, and a handle portion (132) extending perpendicularly from an opposite end of the locating portion. In use, the lever is rotated to engage firmly with the clip for pressing a CPU on the socket, without being unencumbered by other components on the PCB.

15 Claims, 6 Drawing Sheets

LAND GRID ARRAY CONNECTOR ASSEMBLY WITH NON-INTERFERING LEVER

BACKGROUND OF THE INVENTION

1. Field of the Invention

The present invention relates to an electrical connector assembly for electrically connecting an electronic package such as a central processing unit (CPU) with a circuit substrate such as a printed circuit board (PCB), and particularly to a land grid array (LGA) connector assembly having a fastening device for securing the CPU therein.

2. Description of the Prior Art

FIG. 5 shows a conventional land grid array (LGA) connector assembly for electrically connecting an LGA central processing unit (CPU) (not shown) with a printed circuit board (PCB) 8. Also referring to FIG. 6, the LGA connector assembly comprises a fastening device 9 mounted on the PCB 8, and a socket 6 received in the fastening device 9. The fastening device 9 comprises a rectangular frame 91, and a lever 93 and a metal clip 92 respectively pivotally mounted on two opposite sides of the frame 91. The frame 91 comprises a pair of lever cams 911 at an end thereof, a rectangular cavity in a middle thereof for receiving the socket 6 therein, and a pair of mounting slots 913 at an opposite end thereof. Each lever cam 911 defines a guiding groove 912 therethrough. The lever 93 has a pair of locating portions 931 movably received in the guiding grooves 912 of the frame 91, an offset driving portion 933 between the locating portions 931, and a handle portion 932 extending perpendicularly from an end of one of the location portions 931. The metal clip 92 comprises a securing hook 921 at a free end thereof, and a pair of mounting portions 922 at an opposite end thereof. The mounting portions 922 are pivotally engaged with the mounting slots 913 of the frame 91 by a pair of fasteners such as pins 923, respectively.

In use, the clip 92 is firstly oriented perpendicularly to the frame 91, with the locating portions 931 of the lever 93 located at respective bottoms of the guiding grooves 912 of the frame 91, and the driving portion 933 disposed above the locating portions 931. The CPU is attached on the socket 6, and a copper plate (not shown) which functions as a heat dissipation device is attached on the CPU. Then the clip 92 is rotated down to a substantially horizontal position. The handle portion 932 of the lever 93 is rotated from a horizontal position outside the frame 91 upwardly and toward the frame 91, with the locating portions 931 pivoting in the bottoms of the guiding grooves 912. The driving portion 933 reaches the securing hook 921 of the clip 92, and drives the securing hook 921 downwardly. At the same time, the locating portions 931 begin to slide upwardly along the guiding grooves 912 from the bottoms thereof. The locating portions 931 reach respective tops of the guiding grooves 912, with the driving portion 933 being located under the locating portions 931 and firmly pressing down on the securing hook 921. Thus the clip 92 firmly presses the copper plate and the CPU on the socket 6, and the CPU is electrically connected with the PCB.

Conversely, when the handle portion 932 of the lever 93 is rotated up and away from the frame 91, the driving portion 933 of the lever 93 gradually moves from the securing hook 921, and the locating portions 931 progressively move back downwardly along the guiding grooves 912. Once the locating portions have reached the bottoms of the guiding grooves 912, the clip 92 is rotated upwardly to be perpendicular to the frame 91. Then the copper plate and the CPU can be easily taken out from the LGA connector assembly. This may be done, for example, when the CPU is to be replaced by a new higher-speed CPU.

However, as can be seen from FIG. 6, other components such as a retention module 7 are also mounted on the PCB 8 around the LGA connector assembly. The retention module 7 supports a heat sink (not shown) and/or a fan (not shown). During the above-described operations of the lever 93 and the clip 92, the lever 93 is liable to be encumbered by the retention module 7. In particular, the handle portion 932 may not be able to be fully rotated to the horizontal position outside the frame 91. In such case, the securing hook 921 of the clip 92 may not be able to be released from the driving portion 933, and so the clip 92 may not be able to be rotated upwardly. Accordingly, the copper plate and the CPU cannot be taken out from the fastening device 9.

In view of the above, a new LGA connector assembly that overcomes the above-mentioned disadvantages is desired.

SUMMARY OF THE INVENTION

Accordingly, an object of the present invention is to provide an electrical connector assembly such as a land grid array (LGA) connector assembly for electrically connecting an electronic package such as an LGA central processing unit (CPU) with a circuit substrate such as a printed circuit board (PCB), whereby the connector assembly comprises a fastening device having reliable operation unencumbered by other components on the PCB.

To achieve the above-mentioned object, an LGA connector assembly in accordance with a preferred embodiment of the present invention comprises a fastening device mounted on a PCB, and a socket received in the fastening device. The fastening device comprises a rectangular frame, and a lever and a metal clip respectively pivotally mounted to two opposite sides of the frame. The frame comprises a lever cam in a middle of an end thereof. The lever cam defines a locating slot therethough, and comprises a pair of screw surfaces. The clip comprises a securing portion at a free end thereof. A rectangular opening is defined in the securing portion. The lever has a locating portion received in the locating slot of the frame, an L-shaped driving portion extending from an end of the locating portion, and a handle portion extending perpendicularly from an opposite end of the locating portion. In use, the driving portion of the lever is rotated to enter the opening of the securing portion for engaging firmly with the securing portion in the opening, with a CPU pressed on the socket. During rotating the lever, the lever is unencumbered by other components, such as a retention module, on the PCB.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
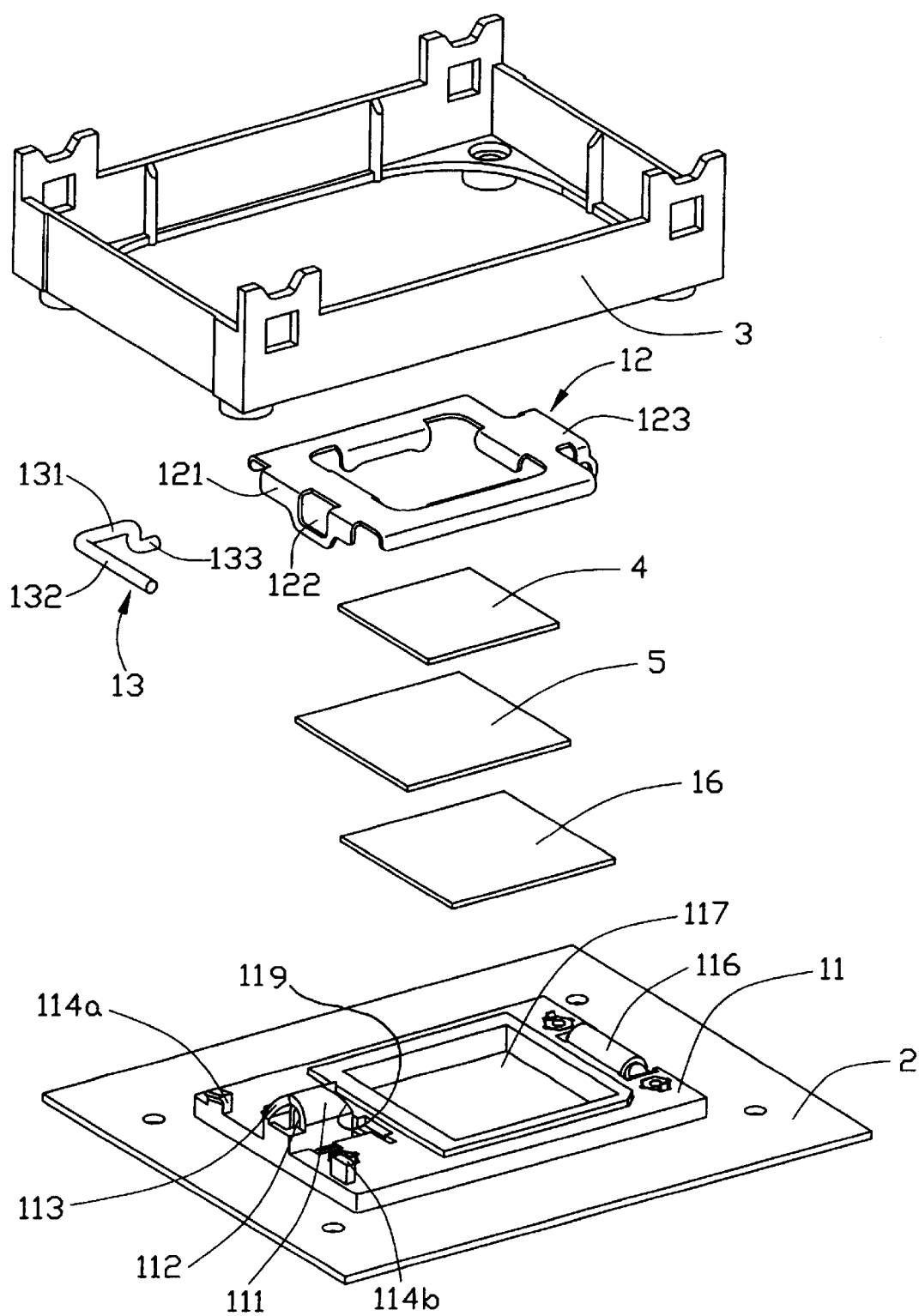
FIG. 1 is an exploded, isometric view of an LGA connector assembly in accordance with the preferred embodiment of the present invention, the LGA connector assembly comprising a clip, a lever and a frame, also showing a retention module, a copper plate, a CPU, and a PCB supporting the frame thereon.
Figure 2:
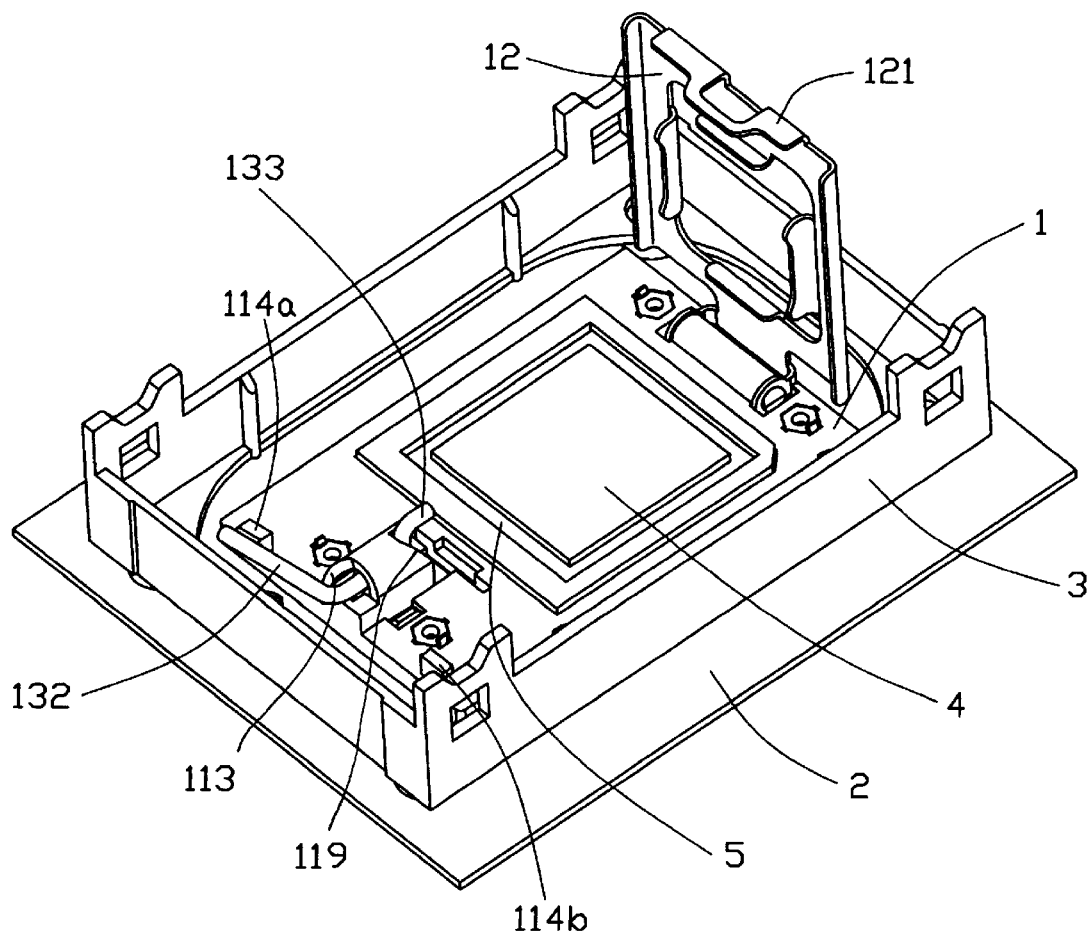
FIG. 2 is an assembled view of FIG. 1, showing the clip oriented perpendicularly to the frame, and a driving portion of the lever disposed above a locating portion of the lever.

Referring to FIGS. 1 and 2, an LGA connector assembly in accordance with the preferred embodiment of the present invention is adapted for electrically connecting an electronic package such as a land grid array (LGA) central processing unit (CPU) with a circuit substrate such as a printed circuit board (PCB). The LGA connector assembly comprises a fastening device 1, and a socket 16 received in the fastening device 1.

Referring to FIG. 1, the fastening device 1 comprises a substantially rectangular frame 11, and a lever 13 and a metal clip 12 respectively pivotally mounted to two opposite sides of the frame 11. The frame 11 comprises a lever cam 111 in a middle of one end thereof, a mounting portion 116 on an opposite end thereof, and a rectangular cavity 117 defined between the lever cam 111 and the mounting portion 116. The lever cam 111 defines a locating slot 112 extending therethrough, and comprises a pair of screw/oblique surfaces 113, 119. A pair of blocks 114a, 114b is formed on opposite sides of the lever cam 111 respectively, for alternately supporting a free end of the lever 13. The clip 12 comprises a tail 123 at an end thereof, and a securing portion 121 depending from an opposite end thereof. A rectangular opening 122 is defined in the securing portion 121. The lever 13 comprises a locating portion 131 received in the locating slot 112 of the frame 11, an L-shaped driving portion 133 extending from an end of the locating portion 131, and a handle portion 132 extending perpendicularly from an opposite end of the locating portion 131.

Referring to FIG. 2, in assembly, the frame 11 is mounted on a PCB 2. The tail 123 of the clip 12 is pivotably mounted on the mounting portion 116 of the frame 11 by fasteners such as pins, and the clip 12 is rotated to lie in a first axis. The locating portion 131 of the lever 13 is pivotally located in the locating slot 112 of the lever cam 111 of the frame 11, and the lever 13 is rotated to lie in a second axis. The second axis is perpendicular to the first axis. The socket 16 is received in the cavity 117 of the frame 11. A rectangular retention module 3 for supporting a heat sink (not shown) and/or a fan (not shown) is mounted on the PCB 2 around the frame 11, with four sidewalls of the retention module 3 closely surrounding the frame 11. The handle portion 132 of the lever 13 is located between the lever cam 111 of the frame 11 and one sidewall of the retention module 3, with the free end of the handle portion 132 engaged on the block 114a.

Figure 3:
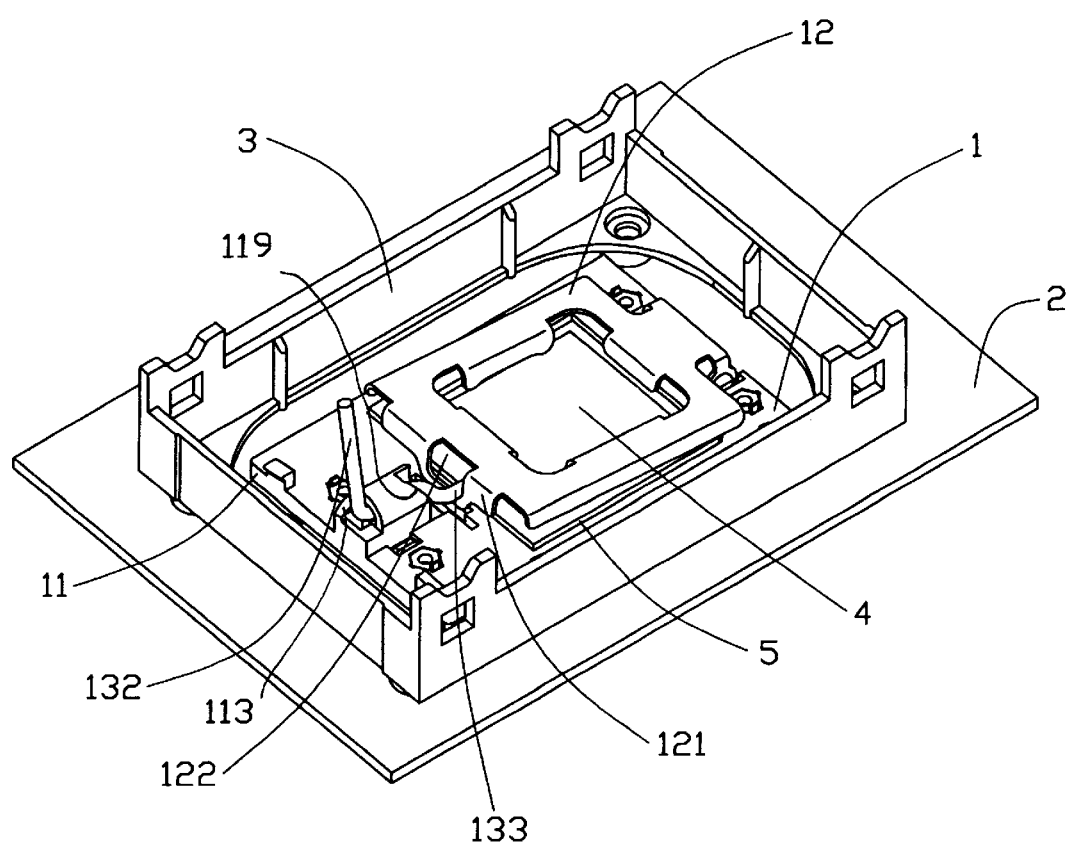
FIG. 3 is similar to FIG. 2, but showing the driving portion entering an opening of a securing portion of the clip, and the driving portion beginning to engage with the securing portion in the opening.
Figure 4:
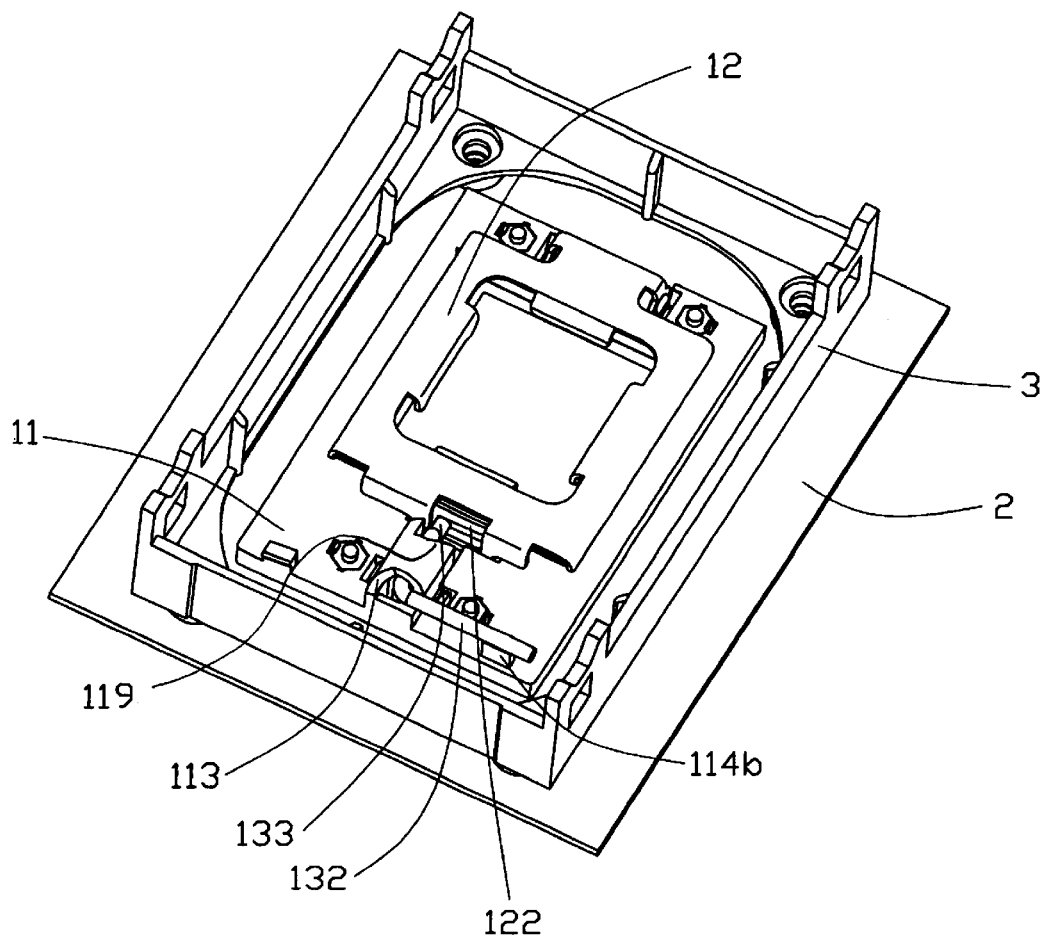
FIG. 4 is also similar to FIG. 3, but showing the driving portion of the lever firmly engaging with the securing portion in the opening.
Figure 5:
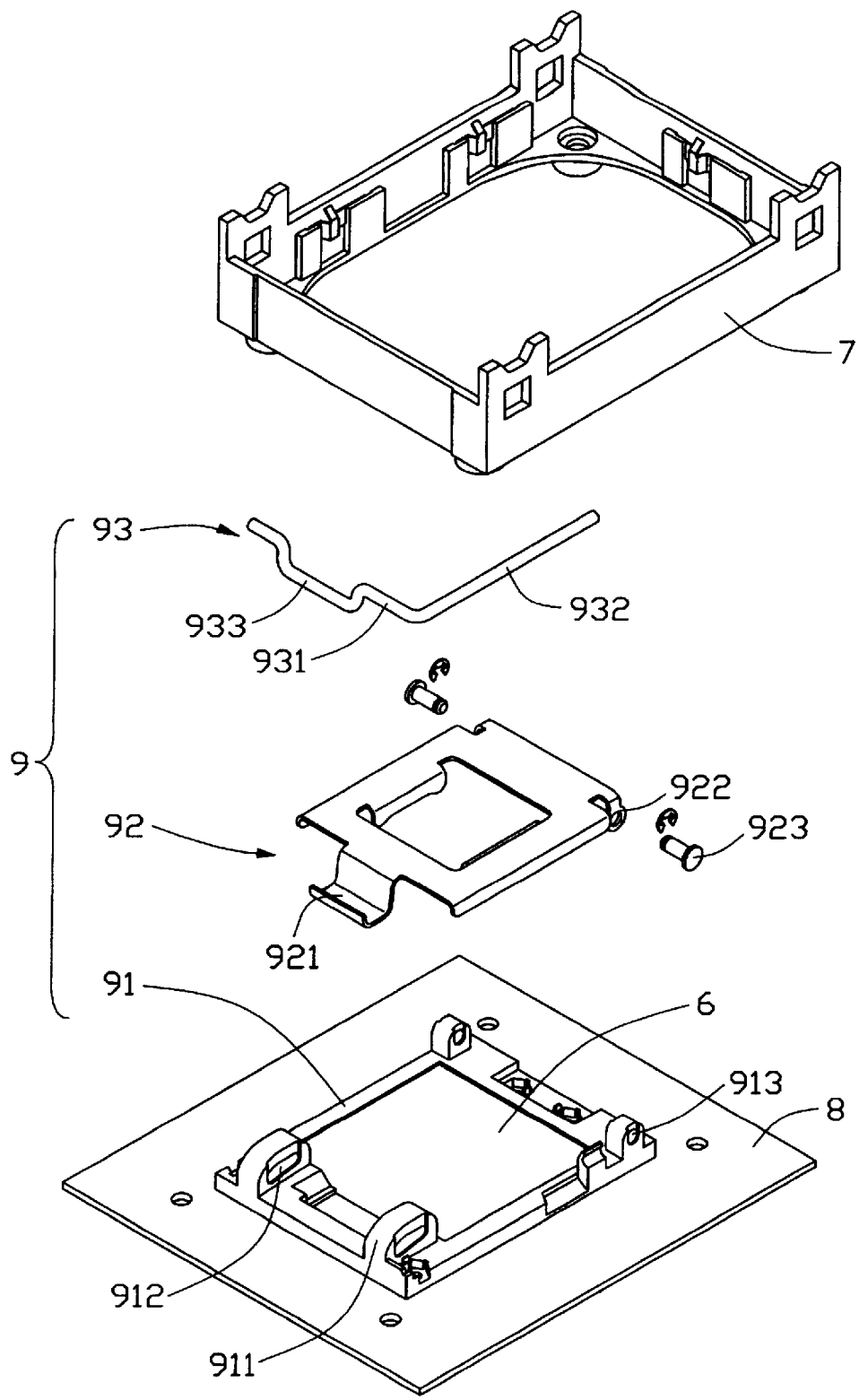
FIG. 5 is an exploded, isometric view of a conventional LGA connector assembly, together with a PCB, and a retention module ready to be mounted on the PCB.
Figure 6:
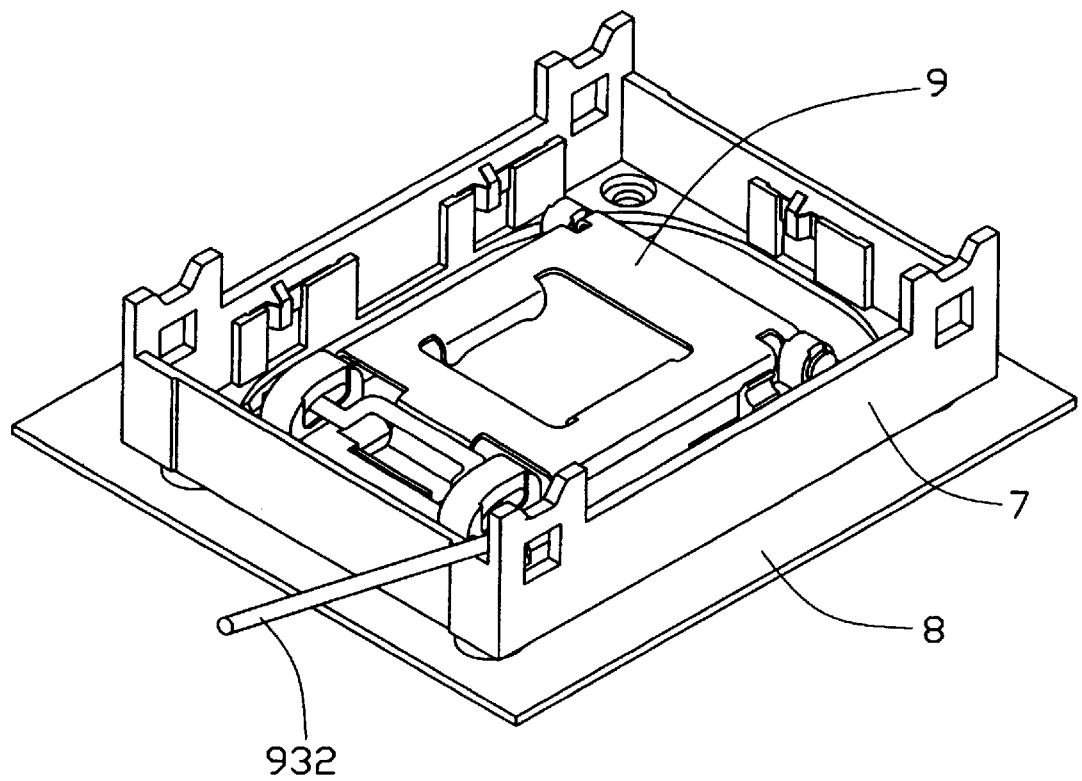
FIG. 6 is an assembled view of FIG. 5, showing a lever of the LGA connector assembly encumbered by the retention module.

In use, the clip 12 lies in the first axis, with the free end of the handle portion 132 of the lever 13 located on the block 114a and the driving portion 133 of the lever 13 disposed above the locating portion 131. A central processing unit (CPU) 5 is attached on the socket 16, and a copper plate 4 which functions as a heat dissipation device is attached on the CPU 5. The clip 12 is then rotated down to loosely contact the copper plate 4. Referring to FIG. 3, the handle portion 132 is rotated up from the block 114a. Because the driving portion 133 abuts against the screw surface 119, the driving portion 133 gradually enters the opening 122 of the securing portion 121 of the clip 12, and the driving portion 133 begins to engage with the securing portion 121 in the opening 122. Referring to FIG. 4, the handle portion 132 is continued to be rotated, so that the driving portion 133 rotates downwardly. The securing portion 121 is pressed downwardly by the driving portion 133 in the opening 122. When the driving portion 133 has reached a position under the locating portion 131, the handle portion 132 is engaged on the block 114b, and the driving portion 133 firmly presses on the securing portion 121 in the opening 122. Thus the clip 12 firmly presses the copper plate 4 and the CPU 5 on the socket 16, and the CPU 5 is electrically connected with the PCB 2.

Conversely, when the handle portion 132 of the lever 13 is rotated up from the block 114b, the driving portion 133 of the lever 13 rotates upwardly and progressively backwardly withdraws from the opening 122 of the clip 12 because of abutment between and the handle portion 132 and the screw surface 113. When the driving portion 133 has reached a position above the locating portion 131, the clip 12 can be rotated upwardly. The copper plate 4 and the CPU 5 can then be freely taken out from the cavity 117 of the frame 11. Thus, for example, a new CPU can be obtained to replace the CPU 5.

As can be seen from FIGS. 2 through 4, during the entire above-described operations of the lever 13 and the clip 12, the handle portion 132 of the lever 13 is located generally between a respective sidewall of the retention module 3 and the lever cam 111 of the frame 11. The free end of the handle portion 132 does not protrude beyond either respective sidewall of the retention module 3, and the lever 13 is unencumbered by the retention module 3. Furthermore, the handle portion 132 is isolated from possible interference by other components that may be mounted on the PCB 2 adjacent the retention module 3. It is noted that in the embodiment, the rotation range of the lever 13 is 180 degrees while the movement of the lever 13 relative to the clip 12 along a lengthwise direction between the clip 12 and the lever 13, occurs only within a 90 degrees range, and the other 90 degrees range is for a phase switch of the clip 12 between a relaxed state and a stress state.

While a preferred embodiment in accordance with the present invention has been shown and described, equivalent modifications and changes known to persons skilled in the art according to the spirit of the present invention are considered within the scope of the present invention as defined in the appended claims. For example, the translation movement may be an alternative way instead of the screwing movement of the current explanatory embodiment.

What is claimed is:

1. An electrical connector assembly comprising a fastening device and a socket mounted in the fastening device, the fastening device comprising:

a frame comprising a lever cam at an end thereof and a mounting portion at an opposite end thereof, the lever cam defining a locating slot extending therethrough;

a clip comprising a securing portion on a free end thereof and a tail on an opposite end thereof for engaging with the mounting portion, the clip rotated to lie in a first axis;

a lever comprising a locating portion located in the locating slot of the lever cam, an L-shaped driving portion extending from an end of the locating portion, and a handle portion extending perpendicularly from an opposite end of the locating portion, when the handle portion rotated to lie in a second axis perpendicularly to the first axis, the driving portion engaging with the securing portion of the clip.

2. The electrical connector assembly as claimed in claim 1, wherein the lever cam is defined in a middle of the end of the frame, and comprises a screw surface.

3. The electrical connector assembly as claimed in claim 2, wherein the securing portion of the clip defines an opening.

4. The electrical connector assembly as claimed in claim 3, wherein when rotating the handle portion, the driving portion enters gradually into the opening because of the configuration of the screw surface, and engages with the securing portion in the opening.

5. The electrical connector assembly as claimed in claim 2, wherein the frame comprises a pair of blocks on opposite sides of the lever cam for alternately supporting a free end of the lever.

6. The electrical connector assembly as claimed in claim 1, wherein the frame defines a rectangular cavity in a middle thereof, for receiving a CPU therein.

7. An electrical connector assembly comprising:

a frame defining opposite first and second ends along a lengthwise direction thereof;

an electronic package located between said first and second ends;

a clip pivotally mounted to the first end for pressing downwardly the electronic package, said clip defining a first pivotal axis extending along said first end and perpendicular to said lengthwise direction; and a lever pivotally mounted to the second end, said lever defining a second pivotal axis extending along said lengthwise direction; wherein said lever is moveable along said lengthwise direction when said lever is rotated about the second pivotal axis so as to latch or unlatch with regard to a distal end of said clip.

8. The assembly as claimed in claim 7, wherein said lever includes a driving portion acting upon the distal end of the clip for latching or unlatching.

9. The assembly as claimed in claim 8, wherein said lever includes a handle portion located opposite to said driving portion and extending in a direction perpendicular to said second axis.

10. The assembly as claimed in claim 8, wherein said driving portion is of an L-shaped configuration.

11. The assembly as claimed in claim 7, wherein said frame defines at least one guiding oblique surface against which the lever moves to result in movement along said lengthwise direction.

12. The assembly as claimed in claim 7, wherein said lever is rotatable in a 180 degrees range wherein movement of the lever along said lengthwise direction occurs only a portion of said range.

13. The assembly as claimed in claim 12, wherein said portion of the range is within 90 degrees.

14. An electrical connector assembly comprising:

a frame defining opposite first and second ends along a lengthwise direction thereof;

an electronic package located between said first and second ends;

a clip pivotally mounted to the first end for pressing downwardly the electronic package, said clip defining a first pivotal axis extending along said first end and perpendicular to said lengthwise direction;

a locking section being located at a distal end of the clip away from the first pivotal axis; and a lever moveably mounted to the second end, a driving portion of said lever being closer to the clip than other portions of said lever along said lengthwise direction; wherein said frame defines at least one oblique surface against which the lever moves so as to not only allow the driving portion to move away from the first end generally along said lengthwise direction for allowing rotation of the clip relative to the frame when said lever is in a releasing position, but allow the driving portion to downwardly press against the locking section when said lever is in a locking position.

15. The assembly as claimed in claim 14, wherein said lever performs rotation about a second pivotal axis along said lengthwise direction when moving between the releasing position and the locking position.

* * * * *